United States Patent [19]

Shono et al.

[11] Patent Number: 5,677,220

[45] Date of Patent: Oct. 14, 1997

[54] METHOD OF MANUFACTURING A SEMICONDUCTOR DEVICE

[75] Inventors: Tomofumi Shono; Akira Asai; Masanori Fukumoto, all of Osaka, Japan

[73] Assignee: Matsushita Electric Industrial Co., Ltd., Osaka, Japan

[21] Appl. No.: 478,110

[22] Filed: Jun. 7, 1995

Related U.S. Application Data

[62] Division of Ser. No. 195,165, Feb. 14, 1994, Pat. No. 5,459,341.

[30] Foreign Application Priority Data

Feb. 12, 1993 [JP] Japan .................................. 5-023928

[51] Int. Cl.⁶ ............................................ H01L 21/70
[52] U.S. Cl. ............................ 437/52; 437/47; 437/48; 437/51
[58] Field of Search ....................... 437/47, 48, 49, 437/50, 51, 52

[56] References Cited

U.S. PATENT DOCUMENTS 5,225,704  7/1993  Wakamiya et al. .................. 257/409
5,393,688  2/1995  Monotami et al. ..................... 437/60

FOREIGN PATENT DOCUMENTS 2-210867  8/1990  Japan .

*Primary Examiner*—Tuan H. Nguyen
*Attorney, Agent, or Firm*—McDermott, Will & Emery

[57] ABSTRACT

A surface region of a P-type semiconductor substrate is defined by an isolation into plural active regions at which a semiconductor element is to be formed. A first diffusion region such as a drain region, a second diffusion region such as a source region, and a wiring member such as a word line are arranged at each active region. The surface of the word line is covered with a first insulating layer. A second insulating layer is provided, in which a region including in common each overhead region on at least two second diffusion regions is removed, leaving an overhead region on the first diffusion region. Provided above the second diffusion region is a conductive member such as a capacity storage electrode, a bit line. A contact member which connects the conductive member and the second diffusion region is formed at a region where the second insulating layer is removed. With the second insulating layer of such configuration, an increase in connection resistance and a connection defect of the capacity storage electrode contact or the bit line contact are prevented.

7 Claims, 16 Drawing Sheets

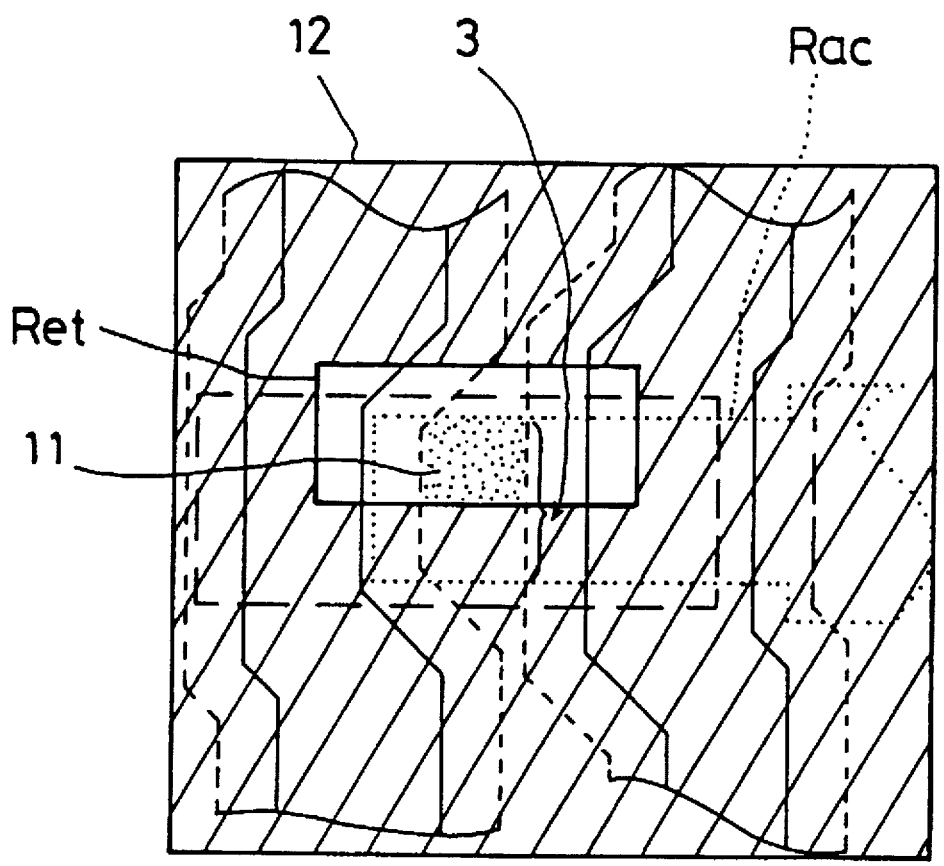

METHOD OF MANUFACTURING A SEMICONDUCTOR DEVICE

This is a divisional of application U.S. application Ser. No. 08/195,165, filed Feb. 14, 1994, now U.S. Pat. No. 5,489,341.

BACKGROUND OF THE INVENTION

This invention relates to a semiconductor device having semiconductor elements such as a DRAM memory cell and a manufacturing method thereof, and particularly relates to a countermeasure for preventing a capacity storage electrode contact, a bit line contact and the like from increase in contact resistance.

In these days, high-density semiconductor devices are required, so that a semiconductor element provided thereto are being miniaturized. Therefore, the dimensions of a contact member which connects the semiconductor element to a wiring and of the overlap portion of the contact member and the element is being minimized.

Referring to accompanying drawings, a conventional semiconductor device is explained below. FIG. 14(a) is a plan view showing a DRAM memory cell array using a conventional stack type capacitor cell. FIG. 14(b) shows a part of FIG. 14(a) in enlarged scale. FIG. 15 is a section, taken along the line XV—XV in FIG. 14(a). As shown in FIG. 14(a) and FIG. 15, a surface region of a P-type semiconductor substrate 1 is defined to a plurality of active regions Rac by an isolations 4. A switching transistor 8 composing the DRAM memory cell is formed at each active region Rac. Formed at each switching transistor 8 are two impurity doped diffusion regions, i.e. a drain region 2 and a source region 3. A gate electrode 7 for controlling channel current is provided, through a gate oxide layer 8, between the drain and the source of each switching transistor, i.e. above a channel region. A word line 5 which connects the gate electrodes 7 of the respective switching transistors is formed over the isolation 4 and the active region Rac. The word line 5 is linearly formed so as to connect adjacent switching transistors in a lateral direction of the plan view of FIG. 14(a).

In the section of FIG. 15, the word line 5 is indicated as a word line on the isolation 4 and as a gate electrode 7 on the active region Rac for convenience sake. Upper and side parts of each electrode 7 are covered with a first insulating layer 9 composed of side walls 9a and upper protection layer 9b, in the form of LDD structure. Accordingly, the drain region 2 and the source region 3 have respectively a heavily doped region and a lightly doped region. Formed on the drain region 2 is a second insulating layer 12 which is patterned after deposition on the entire surface of the memory cell array part. As shown in enlarged scale in FIG. 14(b), a part of the second insulating layer 12 is removed which corresponds to the source region 3 of each switching transistor. In detail, as shown in the section of FIG. 15, the second insulating layer 12 is removed at a region including an overhead region on a part of the source region 3, excepting a part adjacent to the isolation 4, and an overhead region on the first insulating layer 9 therearound. Hereinafter the region is referred to as removed region Ret. A capacity storage electrode 13 is formed on the second insulating layer 12. A capacity insulating layer 14 covers the capacity storage electrode 13, and a plate electrode 15 is formed on the capacity insulating layer 14. As shown in FIG. 14(b), a dotted region indicates a region at which a capacity storage electrode contact 11 for connecting the capacity storage electrode 13 and the source region 3 is to be formed. In general, a play 16 is provided between the capacity storage electrode contact 11 and the source region 3, taking consideration of displacement of photo-masks.

FIG. 16 explains the displacement at a photo-lithography process, wherein a locational displacement arises between a mask for forming each part of the switching transistor 8 and a mask for patterning the second insulating layer 12 at the part corresponding to that in FIG. 14(b). The play 16 between an extreme end of the removed region Ret and an extreme end of the source region 3 is extremely small, 0.05 µm, and it is difficult to form the removed region Ret at the accurate position according to alignment accuracy of the patterning in the photo-lithography technique in the present time. As a result, the removed region Ret may be shifted upward or downward over the play 16 as shown in FIG. 16. In addition to the mask displacement, because of the micro dimension of the removed region Ret (e.g., 1.1 µm×0.5 µm), resolution at the photo-lithography process is so insufficient as to cause a tailing of resist pattern with a result that the tailing part of the resist pattern recedes irregularly at an etching process. Thus, the dimension of the capacity storage electrode contact 11 is unstable.

The above mentioned disadvantages may increase contact resistance and cause connection defect with a decreased area of the capacity storage electrode contact 11.

The present invention has its object of preventing the contact defect due to mask displacement and tailing of the resist pattern at the photo-lithography process.

SUMMARY OF THE INVENTION

To attain the above object, a semiconductor device in the present invention comprises:

a semiconductor substrate having a surface region;

an isolation formed on said semiconductor device, and defining said semiconductor device into a plurality of active regions at which a semiconductor element is to be formed;

a first diffusion region and a second diffusion region which are formed at each active region of said semiconductor substrate, and which are made by diffusing an impurity in the surface region of said semiconductor substrate;

a wiring member provided at said active region on said semiconductor substrate;

a first insulating layer which covers a surface of said wiring member;

a second insulating layer which is provided on said semiconductor substrate, said isolation and said first diffusion layer, and which remains at a region including at least a part of an overhead region on said first diffusion region, being removed at a region including in common each overhead region on at least two second diffusion regions;

a conductive member provided above said second insulating layer; and a contact member which connects said conductive member and said second diffusion region via at least a part of the region where said second insulating layer is removed.

According to the above construction, the area where the contact member which connects the conductive member and the second diffusion region contacts to the second diffusion region is sufficiently ensured. Thus, the contact resistance is restricted to low.

The above construction is applicable to a semiconductor device in which a DRAM memory cell is arranged at each active region of the semiconductor substrate. In this case, the wiring member is a word line of the DRAM memory cell, the first diffusion region is a drain region thereof, the second diffusion region is a source region thereof, the conductive member is a capacity storage electrode, and the contact member is a capacity storage electrode contact which connects the capacity storage electrode and the source region.

In case of the DRAM memory cell, the region where the second insulating layer is removed may be a region including in common each overhead region on a plurality of source regions substantially in parallel with the wiring member or each overhead region on a plurality of source regions arranged across at a right angle to the wiring member.

The above construction is applicable to a semiconductor device in which a field effect transistor is arranged at each active region of the semiconductor substrate. In this case, the wiring member is a gate electrode of the field effect transistor, the first diffusion region is a source region thereof, the second diffusion region is a drain region thereof, the conductive member is a bit line, and the contact member is a bit line contact which connects the bit line and the drain region of the field effect transistor.

In case of the field effect transistor, it is possible that the region where the second insulating layer is removed includes in common each overhead region on the plural drain regions arranged in parallel with the wiring member which composes the gate electrode.

In either case, prevented are the increase in contact resistance of the capacity storage electrode contact and the bit line contact and the connection defect.

Further, in the above construction, a pattern of the remaining part of the second insulating layer may be selective from the form of island and a linearly isolated form along a set direction, such as a form in parallel with the wiring member, a form across at the right angle thereto.

In the present invention, a method of manufacturing a semiconductor device, comprises the steps of:

forming an isolation which defines a semiconductor substrate into a plurality of active regions at which a semiconductor substrate is to be formed;

forming a wiring member and a first insulating layer which covers a wiring member at a region including at least a part of said active region of the semiconductor substrate;

forming a first diffusion region and a second diffusion region by introducing an impurity to the active regions at both sides of the wiring member;

forming a second insulating layer, after an insulating layer to be the second insulating layer is deposited on each active region, the first insulating layer and the isolation, by removing a region including in common each overhead region on at least two second diffusion regions, leaving a region including at least an overhead region on the first diffusion region out of the deposited insulating layer; and forming, above the second diffusion region, a conductive member and a contact member which connects the conductive member and the first diffusion region.

Accordingly, the removed region of the second insulating layer includes the overhead region on the whole second diffusion region when the contact member of the conductive member is formed, then the contact member of the conductive member is self-aligned and formed thereover. Hence, the contact area of the contact member and the second diffusion region is made wide, and the shape of the contact member is improved. Thus forming a semiconductor device with less contact resistance.

The method of manufacturing a semiconductor device is applicable to either case where the semiconductor element is a DRAM memory cell or is a field effect transistor, as well as in the construction of the semiconductor device mentioned above.

BRIEF DESCRIPTION OF THE ACCOMPANYING DRAWINGS

FIGS. 3(a)–3(e) are sections showing a variation of the DRAM memory cell array part at respective manufacturing processes according to the first embodiment.

Figure 4A:
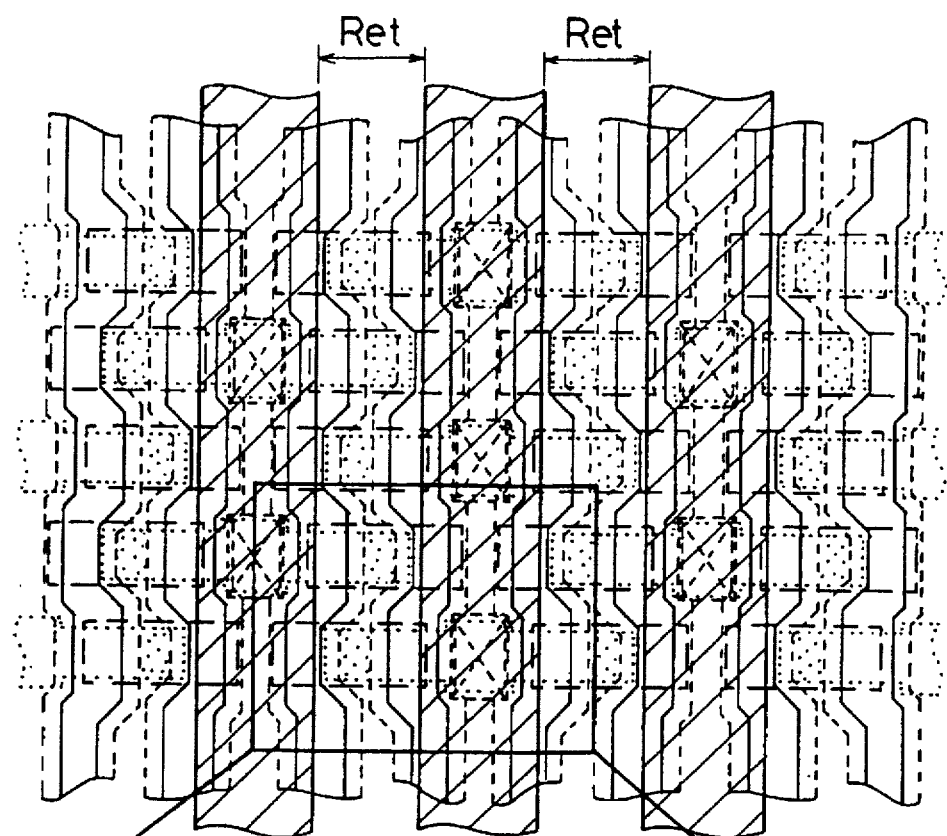
Figure 4:
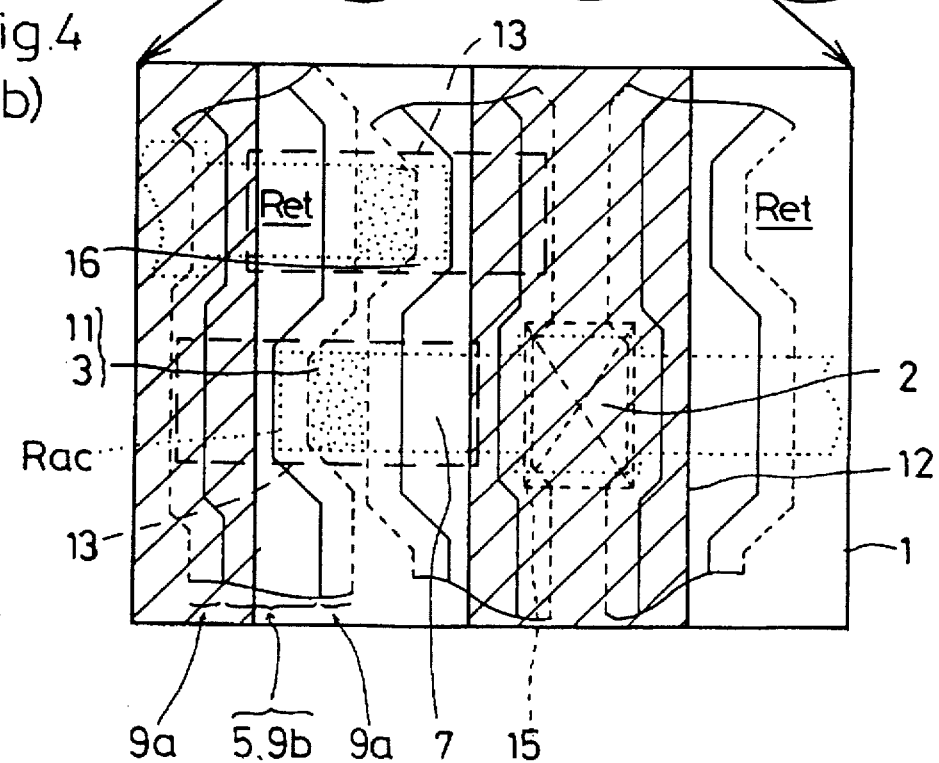

FIG. 4(a) is a plan view of a memory cell array part of a bit line overlaid type DRAM according to a second embodiment.

FIG. 4(b) is an enlarged plan view of a part of FIG. 4(a).

Figure 5A:
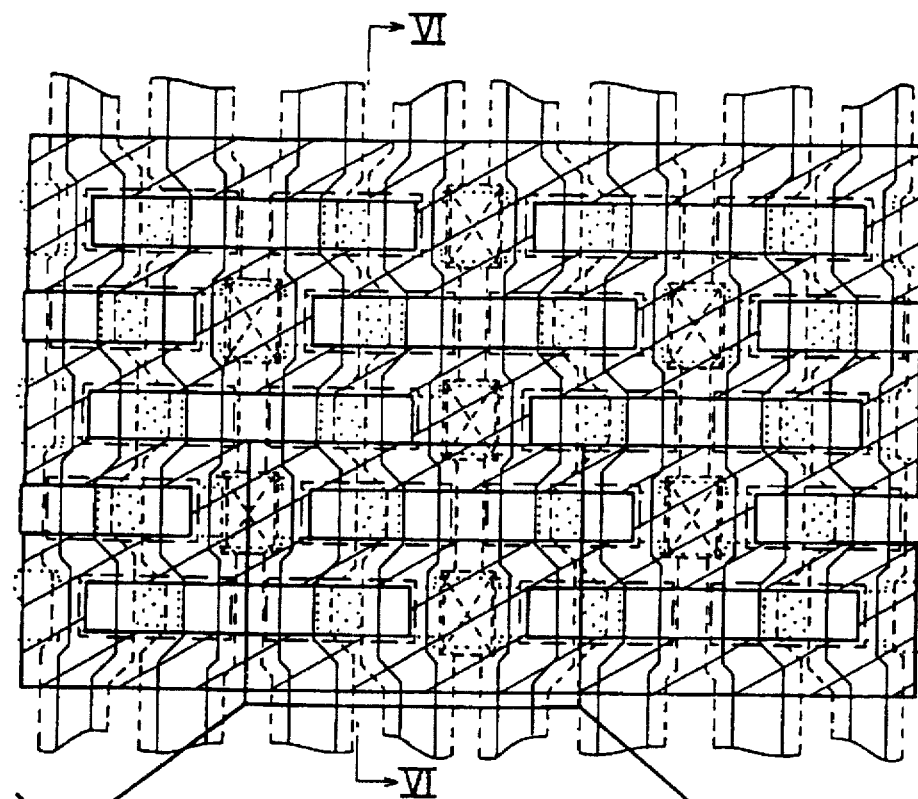

FIG. 5(a) is a plan view of a memory cell array part of a bit line overlaid type DRAM according to a third embodiment.

Figure 5B:
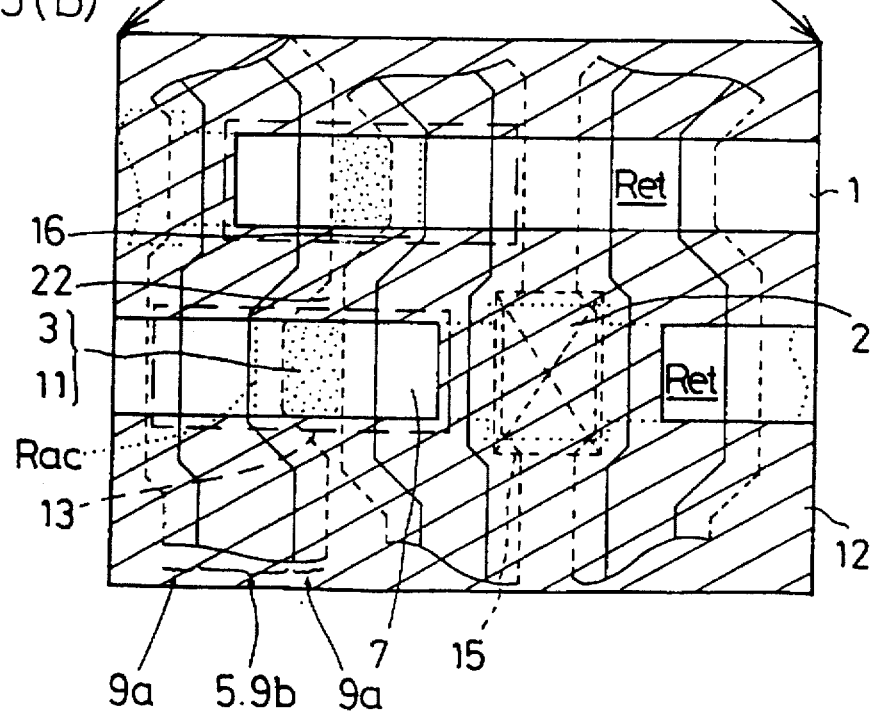

FIG. 5(b) is an enlarged plan view of a part of FIG. 5(a).

Figure 6:
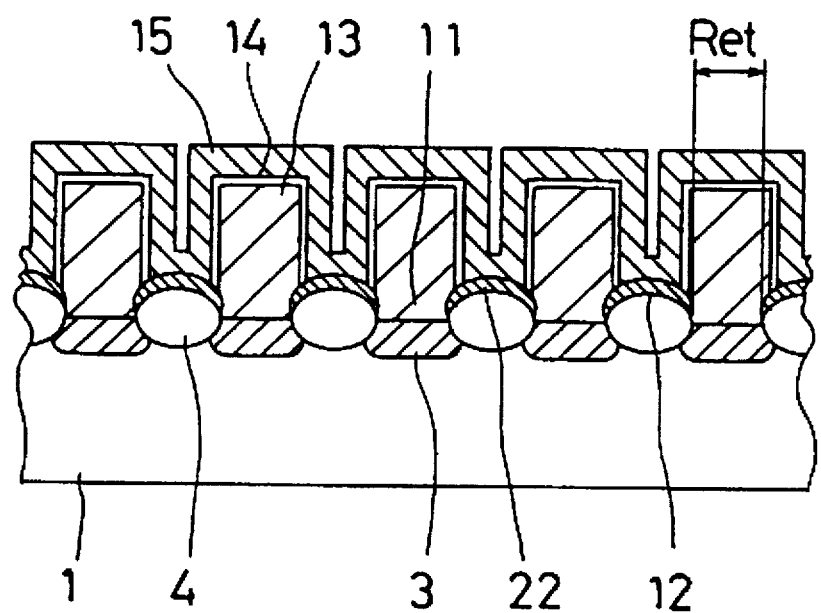

FIG. 6 is a section, taken along a line VI—VI in FIG. 5(a).

Figure 7:
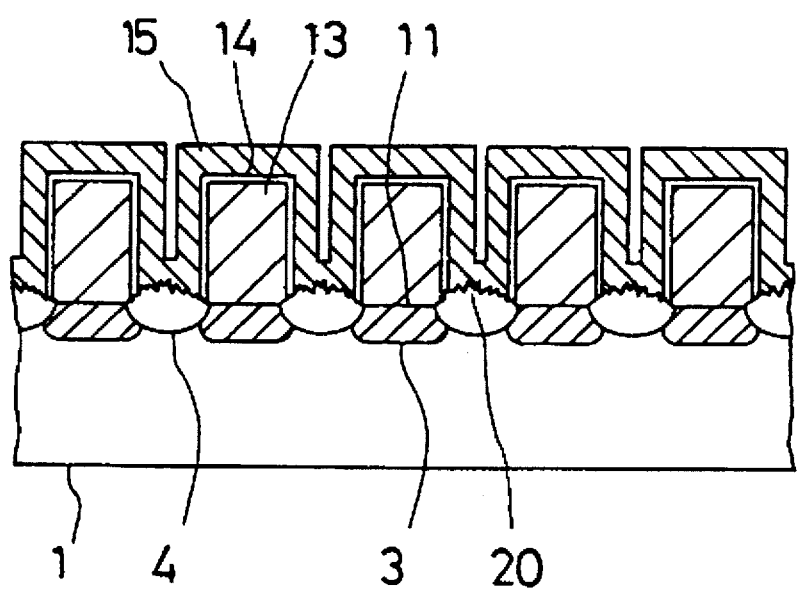

FIG. 7 is a section corresponding to FIG. 6 in case where a second insulating layer is not formed at an isolation at minimum isolation width.

Figure 8A:
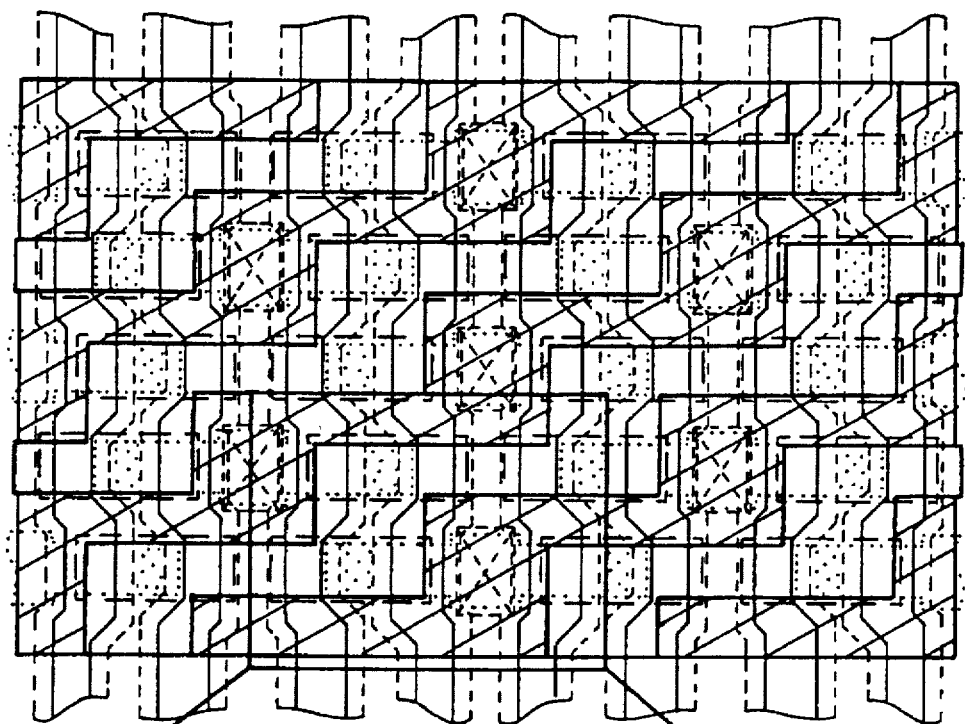

FIG. 8(a) is a plan view of a memory cell array part of a DRAM according to a modification of the third embodiment.

Figure 8B:
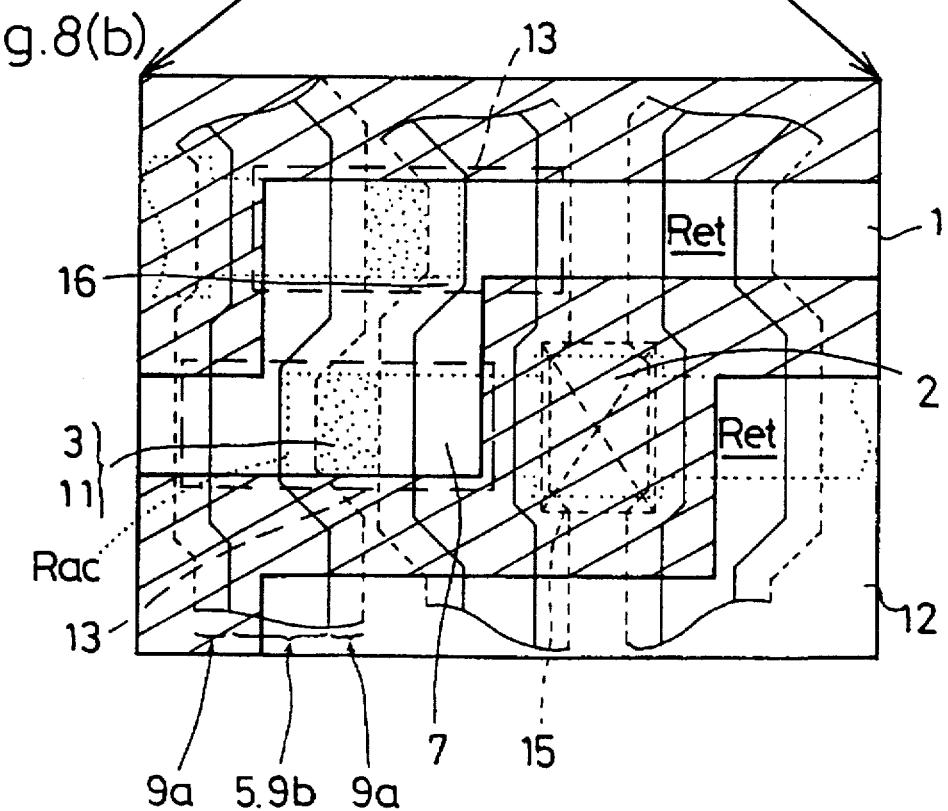

FIG. 8(b) is an enlarged plan view of a part of FIG. 8(a).

Figure 9:
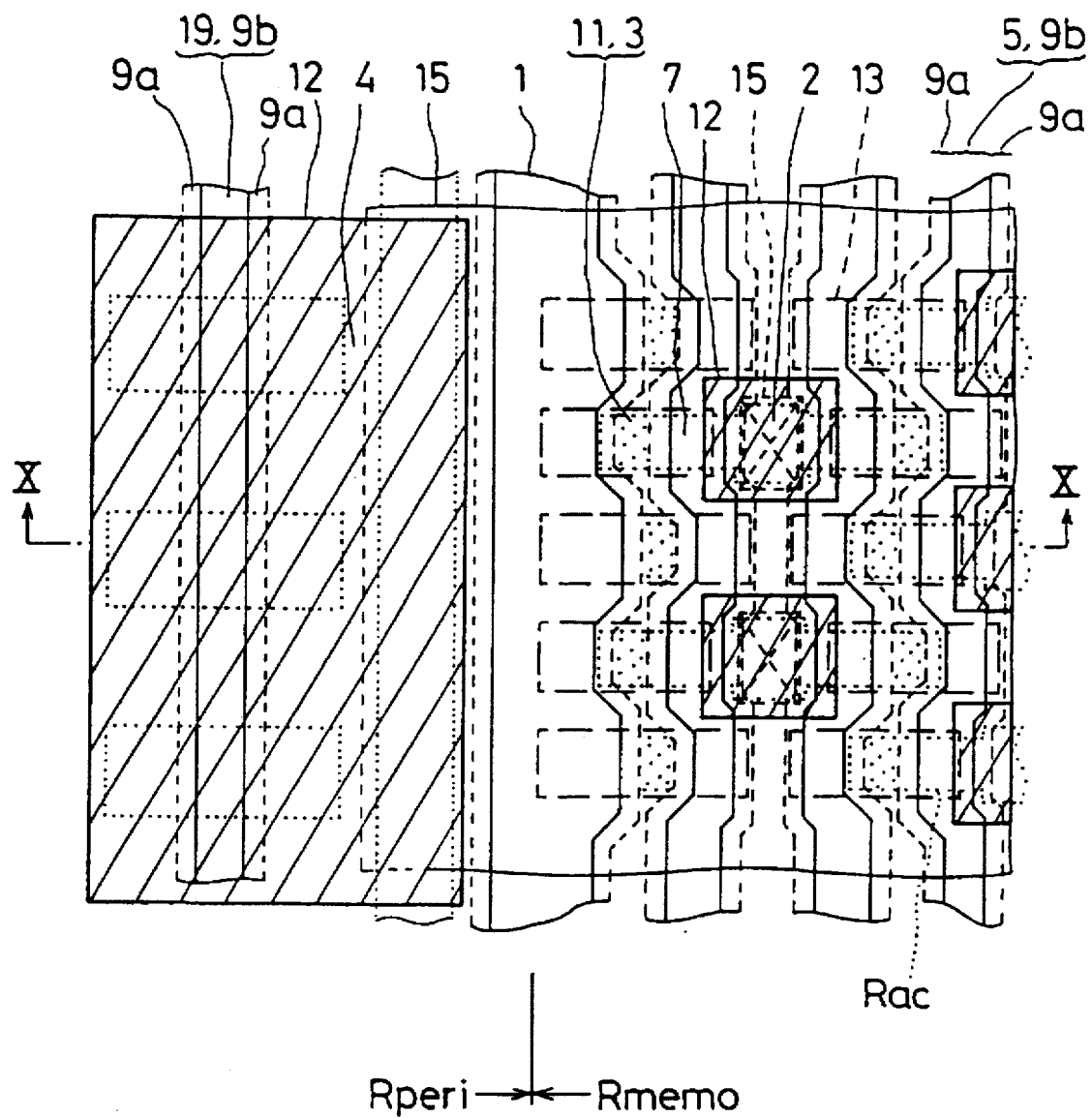

FIG. 9 is a plan view of a memory cell array part of a bit line overlaid type DRAM according to a fourth embodiment.

Figure 10:
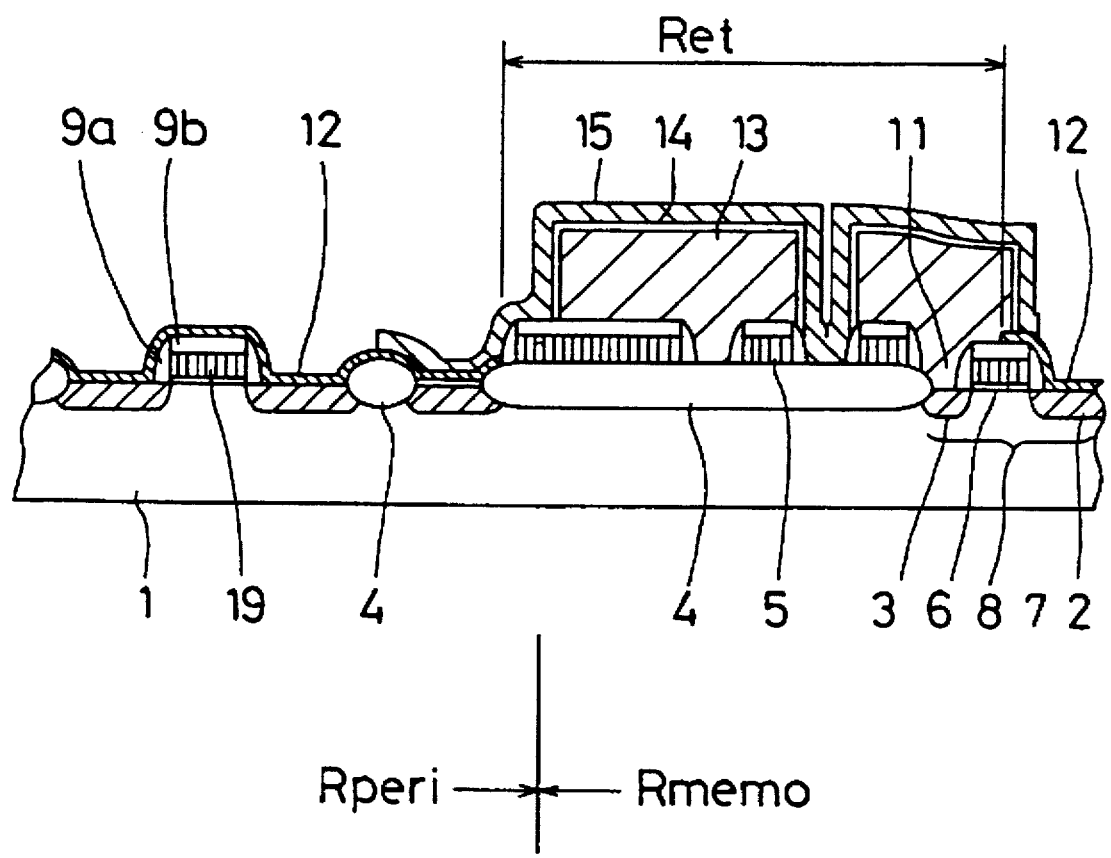

FIG. 10 is a section, taken along a line X—X in FIG. 9.

Figure 11:
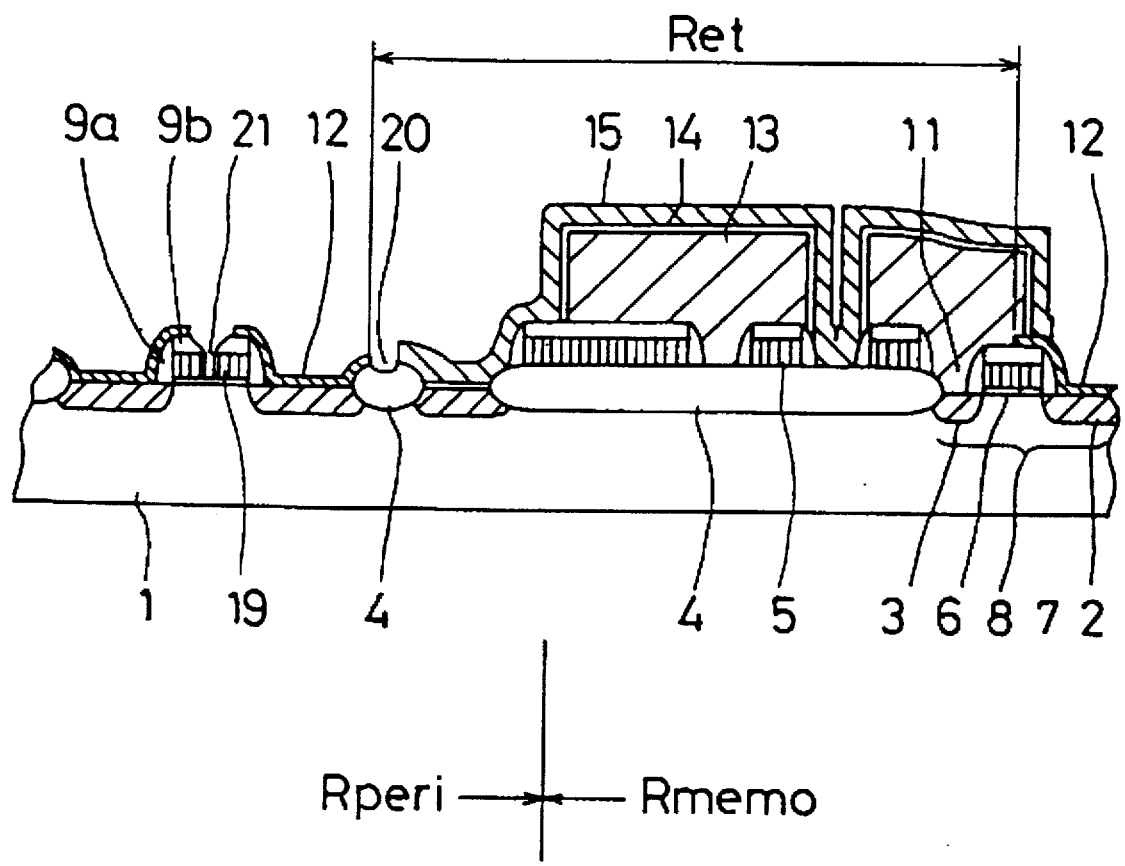

FIG. 11 is a section corresponding to FIG. 10 in case where a removed region of the second insulating layer is located incompletely inside of a region at which a plate electrode is to be formed.

Figure 12:
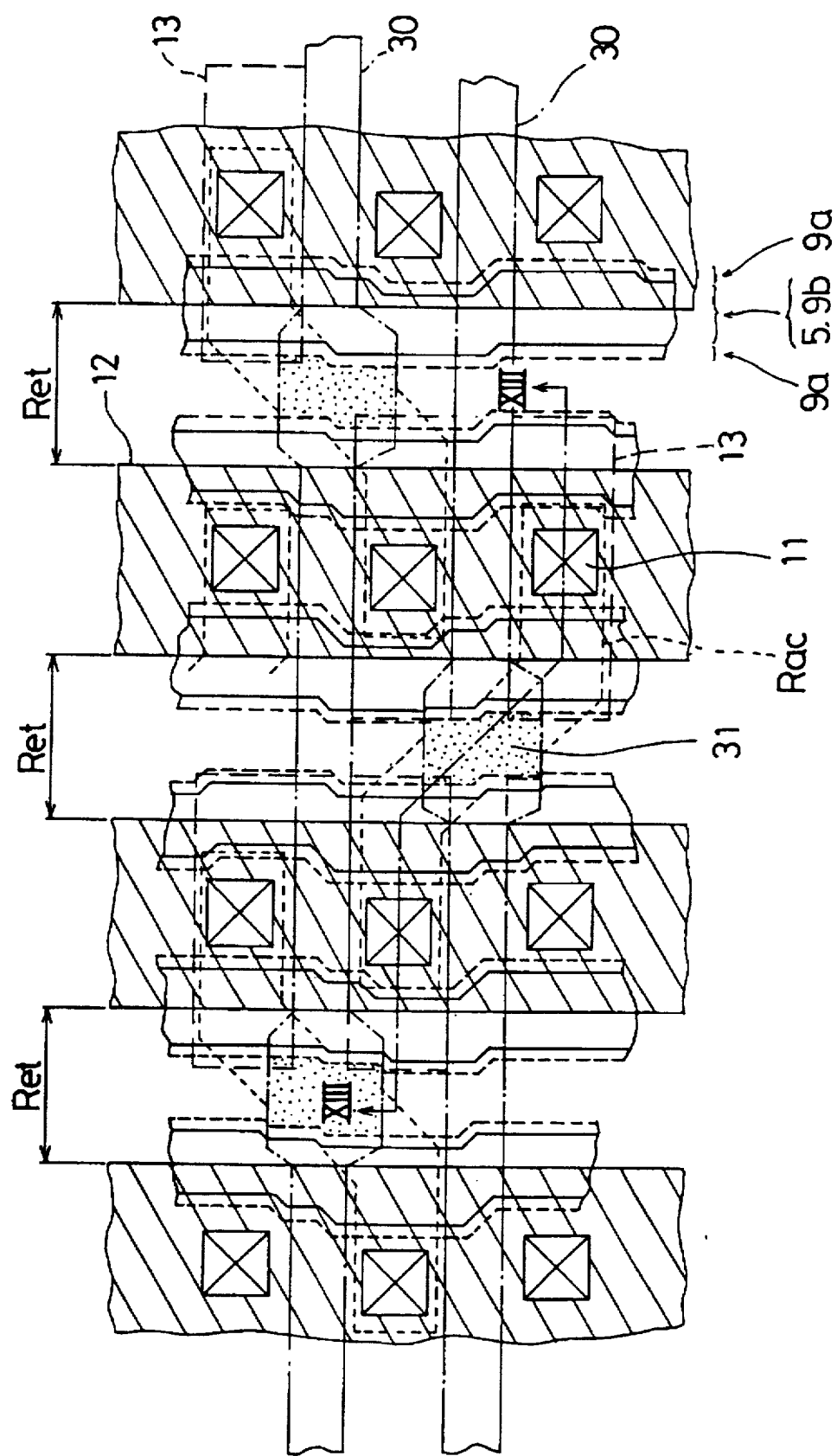

FIG. 12 is a plan view of a memory cell array part of a bit line underlaid type DRAM according to a fifth embodiment.

Figure 13:
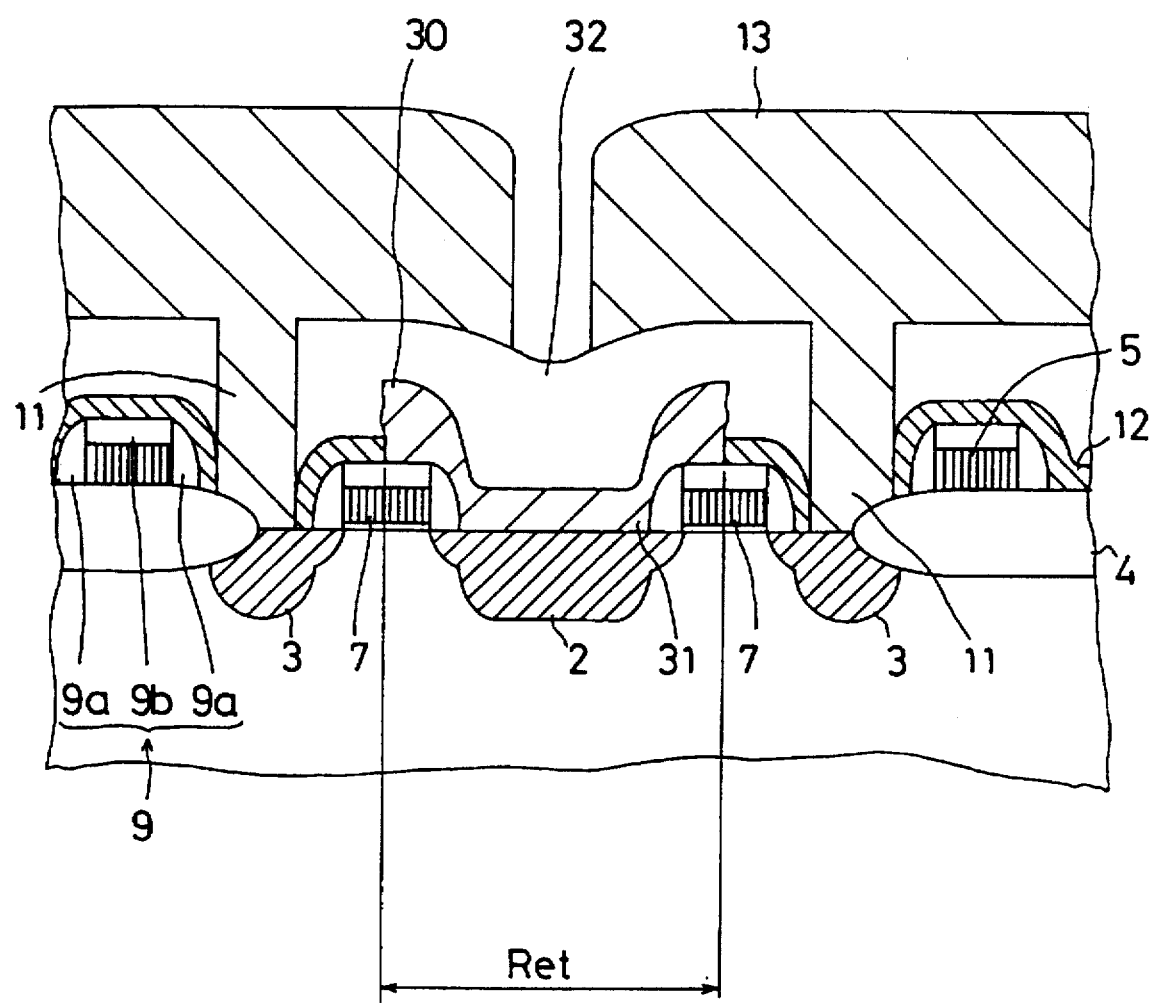

FIG. 13 is a section, taken along a line XIII—XIII in FIG. 12.

Figure 14A:
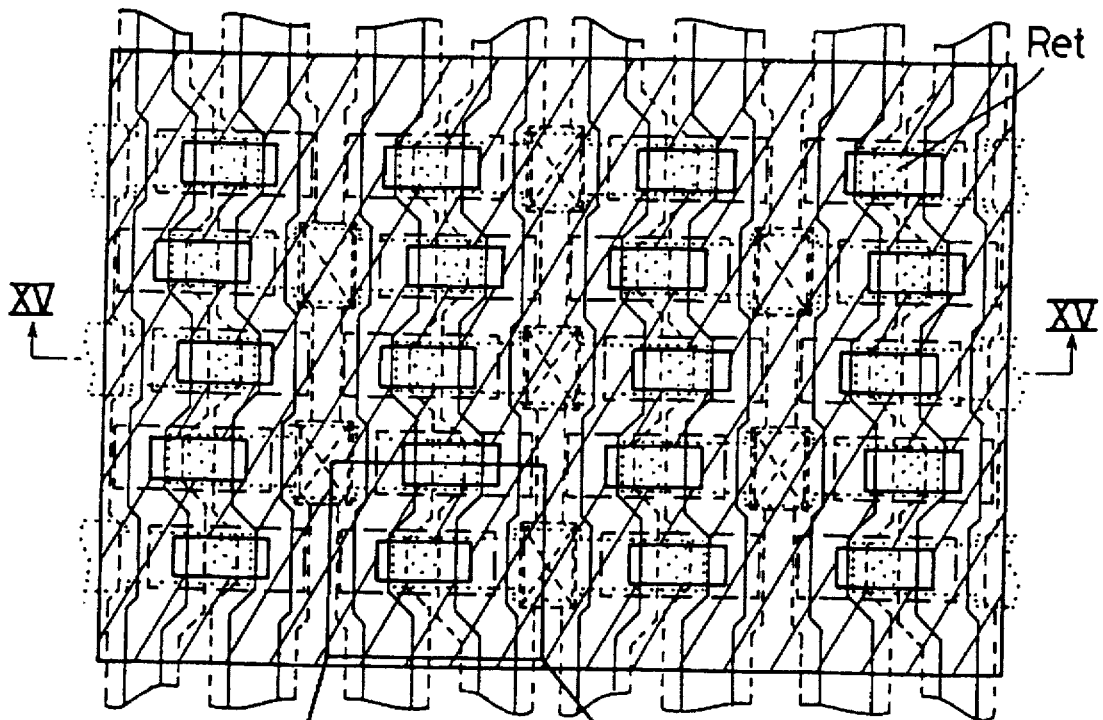

FIG. 14(a) is a plan view of a memory cell array part of a conventional bit line overlaid type DRAM.

Figure 14B:
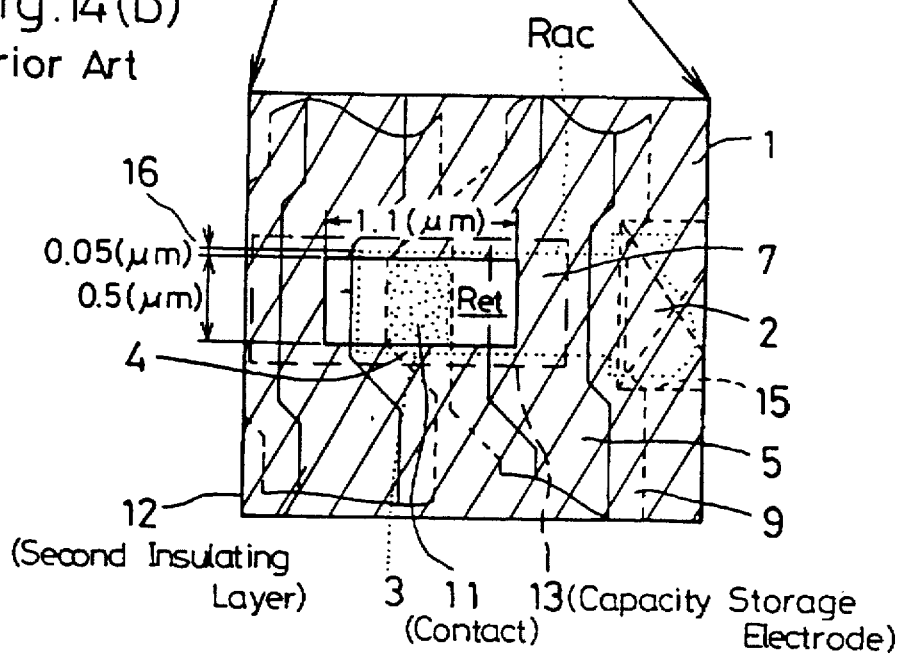

FIG. 14(b) is an enlarged plan view of a part of FIG. 14(a).

Figure 15:
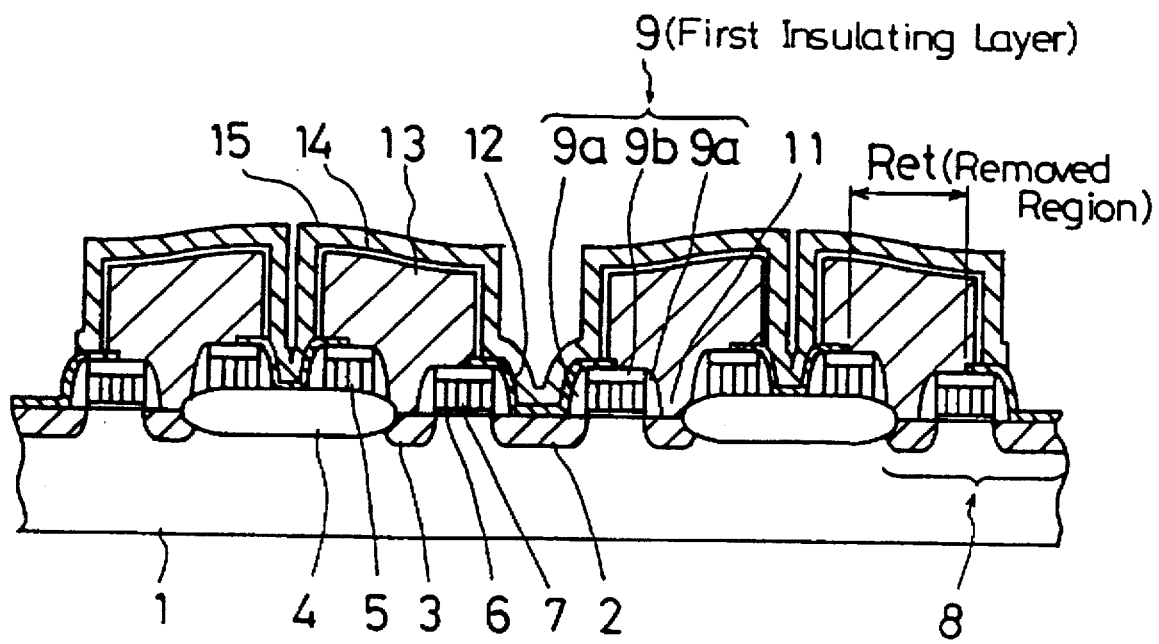

FIG. 15 is a section, taken alone a line XV—XV FIG. 14(a).

FIG. 16 is a plan view showing a state of a removed region Ret of the second insulating layer in case of mask displacement at a photo-lithography process.

PREFERRED EMBODIMENTS OF THE INVENTION (First Embodiment)

Figure 1A:
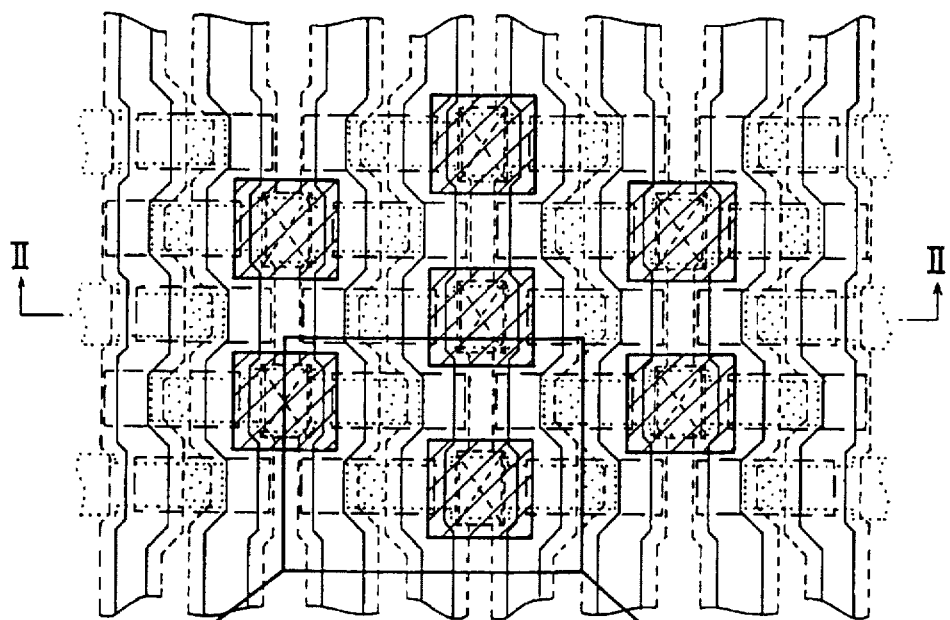
FIG. 1(a) is a plan view of a memory cell array part of a bit line overlaid type DRAM according to a first embodiment.
Figure 2:
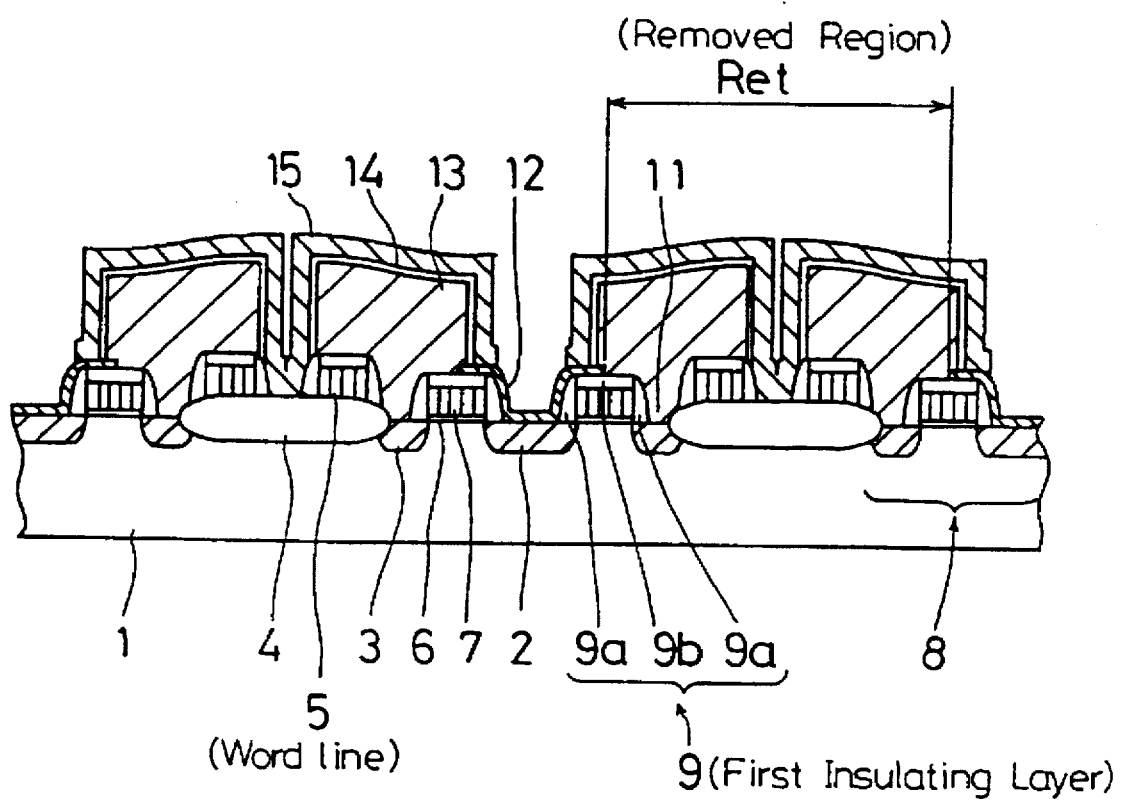
FIG. 2 is a section, taken along a line II—II in FIG. 1(a).

Description is made below about a semiconductor device according to a first embodiment of the present invention with reference to accompanying drawings. FIGS. 1(a) and (b) are plan views showing a DRAM memory cell array part using stack type capacitor cell according to the first embodiment, and correspond to FIGS. 14(a) and (b) respectively. FIG. 2 is a section, taken along a line II—II in FIG. 1(a), and corresponds to FIG. 15. Wherein, any bit lines are formed yet in the respective figures, and the same reference numerals have been used in the respective figures as in FIGS. 14(a), (b) and 15. As well as in the conventional example, one drain region 2 as a first diffusion region and two source regions as a second diffusion region are respectively formed at each active region. In FIGS. 1(a), (b), hatched regions are remaining regions of a second insulating layer 12, and the other region is a removed region Ret where the second insulating layer 12 is removed. The removed region Ret includes each overhead region of each source region 3 of each switching transistor 8, i.e., a plurality of diffusion regions, and the second insulating layer 12 remains at only each overhead region on the drain region 2, and an isolation 4 and a first insulating layer 9 around the drain region 2. A capacity storage electrode contact 11 which is indicated as a dotted region completely conforms to the source region 3 in FIGS. 1(a), (b). In the first embodiment, the second insulating layer 12 remaining by patterning is 1.4 μm×1.2 μm size and an overlap play between the removed region Ret and the source region 3 is 0.3 μm, which are very large.

Discussed next is a method of manufacturing the semiconductor device in the first embodiment, with reference to FIGS. 3(a)–(e).

Figure 3A:
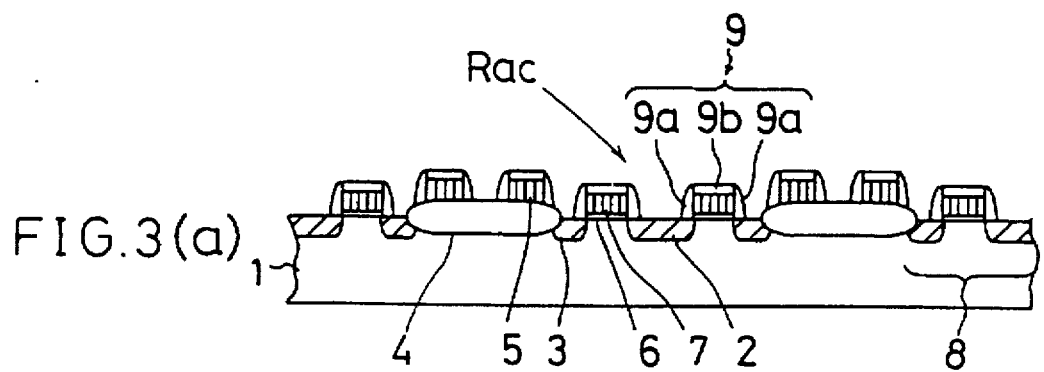

FIG. 3(a) is a section showing a state after respective steps of forming the isolation 4 on a semiconductor substrate 1 and forming a gate oxide layer 6, a gate electrode 7 (word line 5 on the isolation 4), the first insulating layer 9, the drain region 2 and the source region 3 within the active region Rac surrounded by the isolation 4. These steps are conducted according to known techniques for forming a transistor in LDD structure.

Figure 3B:
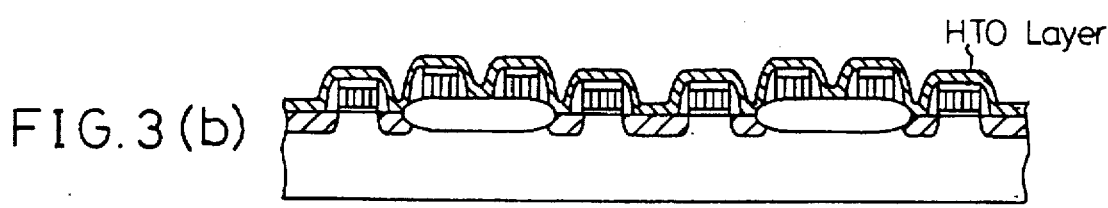
Figure 3C:
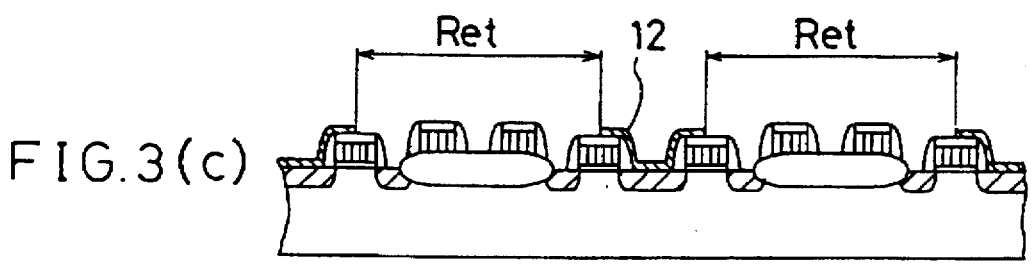

Then, as shown in FIG. 3(b), a 100 nm HTO layer is deposited according to a low pressure CVD method, and the HTO layer is removed leaving an overhead region on the drain region 2 and an overhead region on the isolation 4 and the first insulating layer 9 which are adjacent to the source region 3, as shown in FIG. 3(c), wherein the HTO layer is made of a silicon oxide layer deposited under high temperature. In detail, a photoresist pattern opening at a part where the HTO layer is to be removed is formed at a photo-lithography process, and the second insulating layer 12 is etched using the photoresist pattern as an etching mask and using gas of $CF_4$, $CHF_3$ and Ar to remove the second insulating layer 12 at the opening part. As a result, the second insulating layer 12 remains at the overhead region on the drain region 2 and a part of the overhead region on the first insulating layer 9 and the isolation 4 which are adjacent to the drain region and the other regions, i.e. the source region 3, almost part of the first insulating layer 9 on the word line 5 and almost part of the isolation 4 are exposed. An overhead region on the exposed part is the removed region Ret.

Figure 3D:
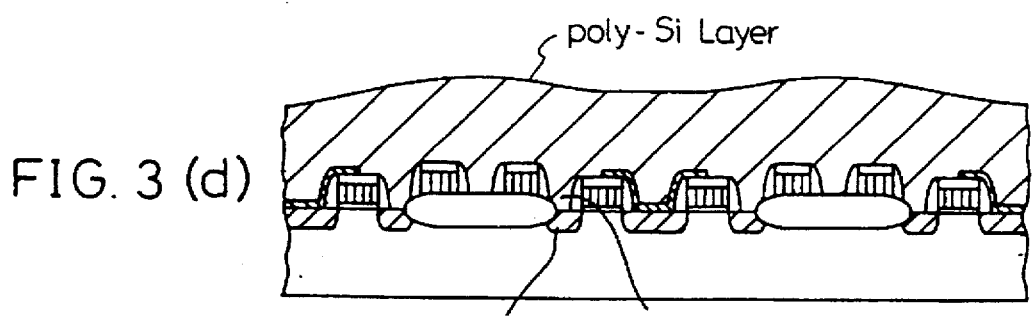

Then, as shown in FIG. 3(d), a 600 nm polysilicon layer is deposited according to the low pressure CVD method. Next, after $1 \times 10^{16}/cm^2$ $P^+$ is implanted with 70 Kev, a resist pattern is formed at a photo-lithography process, and the polysilicon layer is etched using the photoresist pattern as an etching mask to form the capacity storage electrode 13. At this time, the capacity storage electrode contact 11 which connects the capacity storage electrode 13 and the source region 3 is self-aligned and formed at the source region 3 included in the removed region Ret.

Figure 3E:
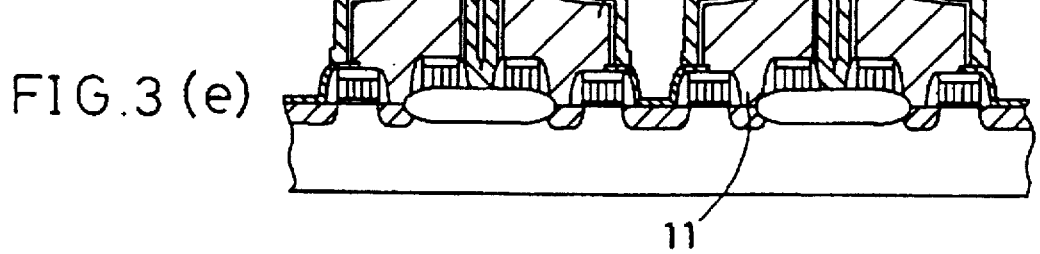

Next, as shown in FIG. 3(e), after a 6 nm $Si_3N_4$ layer is deposited according to the low pressure CVD method, a $SiO_2$ layer is formed on the $Si_3N_4$ layer by pyro-oxidation at 850° C. for 15 minutes to form a capacity insulating layer 14. Then, after a 150 nm DPS layer ($P^+$ added polysilicon layer) is deposited according to the low pressure CVD method, the resist pattern is formed at the photo-lithography process, and the DPS layer is etched using the resist pattern as a etching mask to form a plate electrode 15.

Figure 1B:
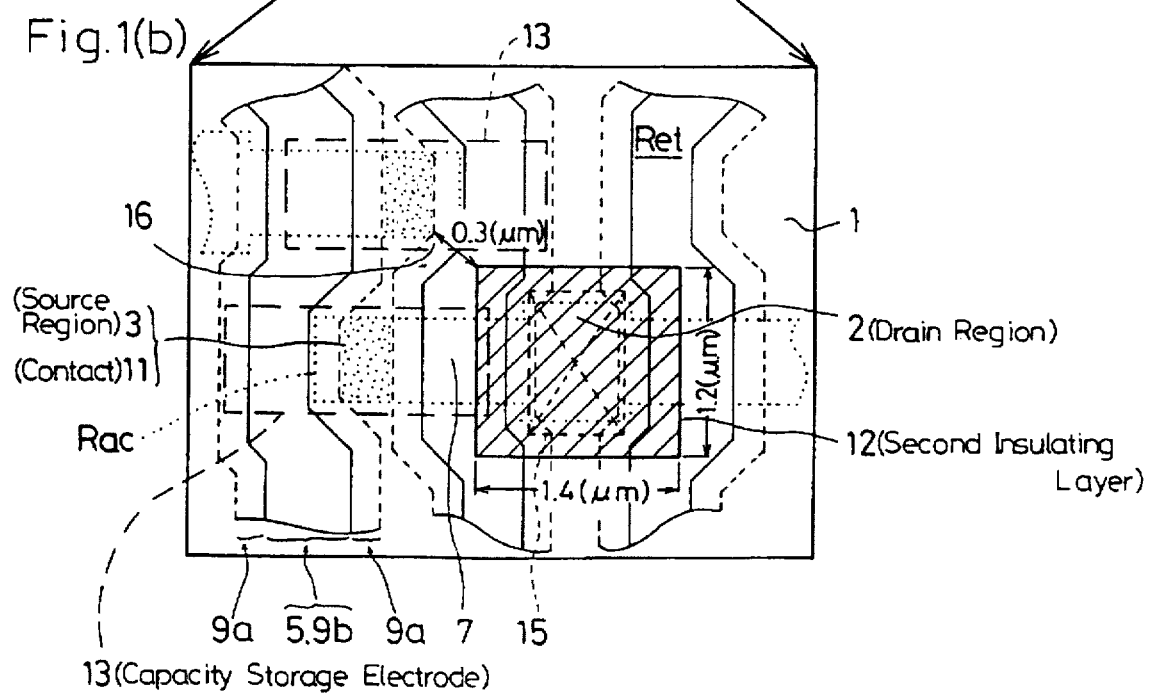
FIG. 1(b) is an enlarged plan view of a part of FIG. 1(a).

As described above, in this embodiment, since the removed region Ret includes in common each overhead region on the plural source regions 3, the isolation 4 and the first insulating layer 9 between each source region 3 are exposed when the polysilicon layer is deposited for forming the capacity storage electrode 13. Further, when the polysilicon layer is deposited, the capacity storage electrode contact 11 is self-aligned and formed only on the source regions 3. As shown in FIG. 1(b), in this embodiment, the remaining second insulating layer 12 is 1.4 μm×1.2 μm in size which makes the area occupied by the removed region Ret larger than that of the conventional one. Thus, insufficient resolution at the photo-lithography process is obviated. In addition, the size of the capacity storage electrode contact 11 depends on the size of the source region 3, being independent from size of the removed region Ret. Consequently, the play between the extreme end of the removed region Ret and the extreme end of the source region 3 is, for example, larger by 0.3 μm in this embodiment than the conventional one of 0.05 μm. Thus, the size and the resistance of the capacity storage electrode contact 11 become constant and the shape thereof is improved even with irregular receding of the resist pattern at the etching process due to tailing of the resist pattern at the photo-lithography process and the displacement between the extreme end of the removed region Ret and the extreme end of the source region 3. In other words, the connection defect and the increase in contact resistance are effectively prevented.

Wherein, in this embodiment, the drain region 2 and the source region 3 respectively have a heavily doped region to which an impurity is heavily doped and a lightly doped region to which an impurity is lightly doped. Also, in this embodiment, the first diffusion region and the second diffusion region are respectively the drain region 2 and the source region 3 which include the lightly doped region and the heavily doped region respectively.

(Second Embodiment)

Described next is about a second embodiment. FIG. 4(a) is a plan view of a semiconductor device according to the second embodiment, and FIG. 4(b) shows a part of FIG. 4(a) in enlarged scale. In this embodiment, also, the semiconductor element to be formed at the active region Rac of the semiconductor device is the switching transistor of a memory cell of a stack type capacitor cell DRAM, the basic structure of which is identical with that in the first embodiment. The sectional construction in the second embodiment is the same as FIG. 2 in the first embodiment, thus omitting such a figure. Wherein, in this embodiment, the second insulating layer 12 remains linearly along a parallel direction with the word line 5. In detail, the remaining part of the second insulating layer 12 includes an overhead region on all drain regions 2 arranged in parallel with the word line 5 and the overhead regions on the first insulating layer 9 and the isolation 4 around each drain region 2. Accordingly, the removed region Ret includes an overhead region on all source regions 3 arranged in parallel with the word lines 5 and the overhead regions on the first insulating layer 9 and the isolation 4 around each source region 3.

As a result, in the second embodiment, as well as in the first embodiment, a space for forming the capacity storage electrode contact 11 is sufficiently ensured, preventing the connection defect and the increase in contact resistance. Especially, compared with the first embodiment, the pattern of the removed region Ret becomes stable since the remaining second insulating layer 12 and the removed region Ret are respectively in the form of line and space. Further, since the area occupied by the removed region Ret is smaller than that in the first embodiment, transformation of the photoresist pattern at the remaining part of the second insulating layer 12 due to light reflection from a member under the removed region Ret is restrained at the photo-lithography process.

(Third Embodiment)

Discussed next is a third embodiment. FIG. 5(a) is a plan view of a semiconductor device according to the third embodiment, FIG. 5(b) shows a part of FIG. 5(a) in enlarged scale, and FIG. 6 is a section, taken along the line VI—VI in FIG. 5(a). In this embodiment, also, the switching transistor of the DRAM memory cell is arranged at the active region Rac of the semiconductor device, wherein the basic structure of the DRAM memory cell is substantially identical with that in first and second embodiments.

Referring to the feature in the third embodiment, the removed region Ret of the second insulating layer 12 is a region including in common each overhead region on the two source regions arranged across at the right angle to the word line 5 and a part of an overhead region on the first insulating layer 9 and the isolation 4 around each source region 3. Therefore, as in first and second embodiments, the connection defect and increase in contact resistance of the capacity storage electrode contact 11 are effectively prevented.

In this embodiment, as shown in FIG. 6, the remaining part of the second insulating layer 12 includes a region 22 at which the width of the isolation 4 is minimum. While, in case where the second insulating layer 12 and the capacity storage electrode 18 are removed at the region 22 of minimum width isolation 4, as shown in FIG. 7, the thickness of the isolation 4 for electrically isolating between the adjacent source regions 3 in parallel direction with the word line 5 is decreased by over-etching of the second insulating layer 12 at the patterning of the second insulating layer 12, which involves lowering of isolation function of the isolation 4. In this embodiment, such a lowering of isolation function of the isolation 4 is effectively prevented.

The removed region Ret may be, as shown in FIG. 8, an overhead region on a region connecting in the form of zigzag line among the plural source regions 3 of the DRAM memory cell. In this case, the removed region Ret includes in common the overhead region on the plural source regions 3 arranged across at nearly the right angle to the word line 5.

(Fourth Embodiment)

A fourth embodiment is discussed next. FIG. 9 is a plan view of a semiconductor device according to the fourth embodiment, FIG. 10 is a section, taken along the line X—X in FIG. 9. In the figures, the DRAM memory cell is arranged at a region Rmemo and a transistor of a peripheral circuit is arranged at a region Rperi. The structure of the DRAM memory cell array part is identical with that in the first embodiment. In the peripheral circuit, the second insulating layer 12 remains at an overhead region on a region including the first insulating layer 9 which covers the wiring member 19 composing a gate electrode of the transistor, the isolation 4 and the active region Rac. Wherein, the bit line of the DRAM memory cell and the bit line and the word line of the transistor of the peripheral circuit are not yet formed in the figures.

As shown in FIG. 10, in this embodiment, the extreme end of the plate electrode 15 does not extrude outward from the extreme end of the second insulating layer 12 at the formation of the plate electrode 15 after the second insulating layer 12 is formed. Accordingly, at the patterning by etching after the layer composing the plate electrode 15 is deposited, there always presents the second insulating layer 12 at an underlayer to be etched. In case where the extreme end of the plate electrode 15 extrudes outward of the extreme end of the second insulating layer 12, as shown in FIG. 11, the isolation 4 is decreased in thickness such as at a region 20 by over-etching or the first insulating layer 9 is decreased in thickness such as at a region 21 at the patterning of the plate electrode 15. This may cause breakdown of the gate electrode 7. This embodiment effectively obviates such disadvantages.

(Fifth Embodiment)

Hereinafter discussed is a fifth embodiment. FIG. 12 is a plan view of a semiconductor device according to the fifth embodiment, and FIG. 13 is a section, taken along the line XIII—XIII in FIG. 12 and shows a construction of a bit line underlaid type DRAM memory cell. In this embodiment, as well as in each embodiment, the first insulating layer 9 is formed on the gate electrode 7 (word line 5), and the second insulating layer 12 is deposited on the source region 3 as the first diffusion region, the drain region 2 as the second diffusion region, the first insulating layer 9 and the isolation 4. Provided on the second insulating layer 12 is a bit line 30 to be connected to the drain region 3. At that time, the second insulating layer 12 is removed at the overhead region on each drain region 2 arranged in parallel with the word line 5 and the overhead region on the first insulating layer 9 and the isolation 4 around each drain region 2, leaving at least the overhead region on the source region 3 of each DRAM memory cell and the overhead region on the first insulating layer 9 and the isolation 4 around each source region 3. A bit line contact 31 is provided via the removed region Ret. An inter-laid insulating layer 32 is provided on the bit line 30. After the capacity storage electrode 13 is formed on the inter-laid insulating layer 32, the capacity storage electrode contact 11 is formed so as to pass through the second insulating layer 12 on the source region 3.

According to the fifth embodiment, the contact area the bit line 30 is sufficiently ensured, preventing connection defect and line breakdown.

In each embodiment, the semiconductor device to which the DRAM memory cell is arranged as the semiconductor element is described, however the embodiments are applicable to other semiconductor elements.

Further, in each embodiment, the removed region of the second insulating layer 12 includes in common each overhead region on each drain region 2 of the plural active region Rac or each overhead region of each source region 3. However, the present invention is not limited to the embodiments. In case where one active region Rac has three or more diffusion regions, such as two first diffusion regions and one second diffusion regions, the second insulating layer 12 may be removed at a region including in common each overhead region on the two first diffusion regions within the one active region.

We claim:

1. A method of manufacturing a semiconductor device, comprising the steps of:

forming an isolation which defines a semiconductor substrate into a plurality of active regions at which a MISFET of a DRAM memory cell is to be formed;

forming a word line and a first insulating layer which covers said word line at a region including at least a part of each active region of said semiconductor substrate;

forming a first diffusion region and a second diffusion region by introducing an impurity to each active region, said first diffusion region and said second diffusion region functioning as a source or drain;

forming a second insulating layer, by depositing an insulating film on each active region, said first insulating layer and the isolation, removing a part of the insulating film including in common each overhead region in contact with at least two second diffusion regions out of the diffusion regions in the active regions and an isolation disposed between said two second diffusion regions, leaving another part of said insulating film including at least an overhead region in contact with said first diffusion region; and forming, above said second diffusion region in each active region, a conductive member and a contact member that connects said conductive member and said second diffusion region by depositing a conductive film entirely over the substrate and then removing a part of said conductive film, leaving a part of said conductive film in contact with said second diffusion region.

2. The method of manufacturing a semiconductor device according to claim 1, wherein a drain region of said MISFET of said DRAM memory cell is formed as said first diffusion region, wherein a source region of said MISFET of the DRAM memory cell is formed as said second diffusion region, wherein a capacity storage electrode is formed as said conductive member, and wherein a capacity storage electrode contact which connects said capacity storage electrode and said source region of said MISFET of said DRAM memory cell is formed as the contact member.

3. The method of manufacturing a semiconductor device according to claim 2, wherein at said step for forming said second insulating layer, a region including in common each overhead region on a plurality of source regions arranged in parallel with said word line is removed out of the insulating film.

4. The method of manufacturing a semiconductor device according to claim 2, wherein at said step for forming said second insulating layer, a region including in common each overhead region on a plurality of source regions arranged across at a right angle to said word line is removed out of the insulating film.

5. The method of manufacturing a semiconductor device according to claim 2, further comprising the steps of:

forming a peripheral circuit of said DRAM memory cell;

forming a conductive layer on said capacity storage electrode; and forming a plate electrode, wherein said step for forming said second insulating layer is conducted so that the removed region of said second insulating layer is located inside of a region at which said plate electrode is to be formed.

6. The method of manufacturing a semiconductor device according to claim 1, wherein a gate electrode of said MISFET of said DRAM memory cell is formed as a wiring member, wherein a source region of said MISFET of said DRAM memory cell is formed as said first diffusion region, wherein a drain region of said MISFET of said DRAM memory cell is formed as said second diffusion region, wherein a bit line is formed as said conductive member, and wherein a bit line contact which connects the bit line and is formed as said contact member.

7. The method of manufacturing a semiconductor device according to claim 6, wherein at said step for forming said second insulating layer, a region including in common each overhead region on a plurality of drain regions arranged substantially in parallel with said wiring member forming said gate electrode is removed.

* * * * *